(12) United States Patent
Yang

(10) Patent No.: US 7,192,811 B2
(45) Date of Patent: Mar. 20, 2007

(54) READ-ONLY MEMORY DEVICE CODED WITH SELECTIVELY INSULATED GATE ELECTRODES

(75) Inventor: Chun-Yi Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 462 days.

(21) Appl. No.: 10/601,958

(22) Filed: Jun. 23, 2003

(65) Prior Publication Data

US 2004/0256637 A1    Dec. 23, 2004

(51) Int. Cl.
*H01L 21/82* (2006.01)

(52) U.S. Cl. .................. 438/128; 257/209
(58) Field of Classification Search .......... 438/199, 438/128–129; 257/200–210, 300–316
See application file for complete search history.

(56) References Cited

U.S. PATENT DOCUMENTS

| | | | | |
|---|---|---|---|---|
| 5,812,448 A * | 9/1998 | Wen | ............................ | 365/182 |
| 6,046,482 A * | 4/2000 | Lu et al. | ...................... | 257/390 |
| 2002/0033495 A1 * | 3/2002 | Kim | ........................... | 257/296 |
| 2003/0213992 A1 * | 11/2003 | Kubo | ......................... | 257/326 |
| 2003/0228717 A1 * | 12/2003 | Li et al. | ........................ | 438/95 |
| 2003/0235941 A1 * | 12/2003 | Chen | .......................... | 438/129 |
| 2004/0029347 A1 * | 2/2004 | Chang et al. | ............... | 438/275 |
| 2004/0119106 A1 * | 6/2004 | Hsieh | .......................... | 257/314 |

* cited by examiner

Primary Examiner—Nathan W. Ha
(74) Attorney, Agent, or Firm—Stout, Uxa, Buyan & Mullins, LLP

(57) ABSTRACT

During fabrication of a mask read-only memory (ROM) device, a dielectric layer is grown on a substrate. Strip-stacked layers are formed on the dielectric layer, with each strip-stacked layer including a polysilicon and a silicon nitride layer. Source/drain regions are formed in the substrate between the strip-stacked layers, and spacers are then deposited between the strip-stacked layers. The strip-stacked layers are patterned into gates, which are disposed over every code position, with silicon nitride pillars being disposed on the gates. Additional spacers are formed on gate sidewalls. The silicon nitride pillars are removed, exposing the gates. A mask is then formed to cover active code positions, in accordance with the desired programming code. Insulating layers are then deposited through the mask onto the exposed gates. When the mask is removed, word lines are formed, interconnecting the gates without the insulating layers.

24 Claims, 7 Drawing Sheets

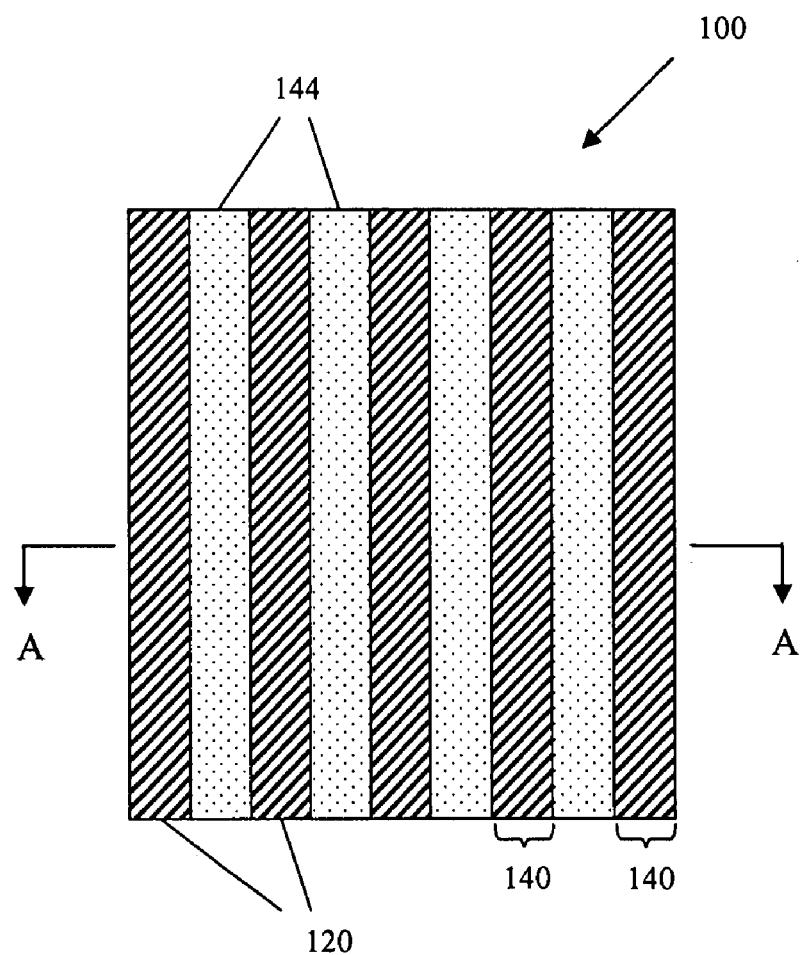
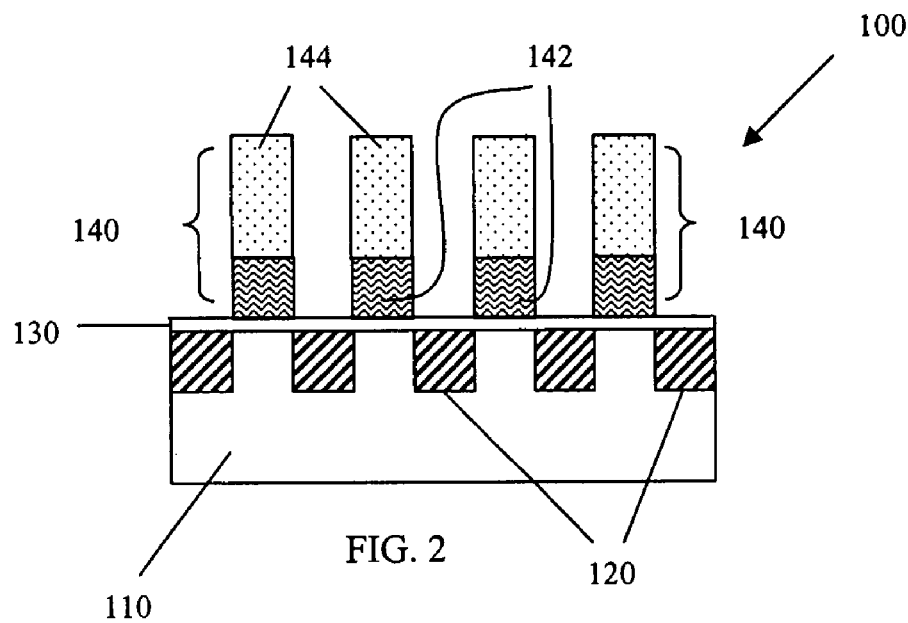

READ-ONLY MEMORY DEVICE CODED WITH SELECTIVELY INSULATED GATE ELECTRODES

BACKGROUND OF THE INVENTION

1. Field of the Invention

The present invention relates generally to semiconductor fabrication methods and, more particularly, to semiconductor mask-programmable read-only memory devices and methods for fabrication of such devices.

2. Description of Related Art

As the information revolution continues to unfold, the numbers and capabilities of computers and of other digital systems continue to increase. One of the common, and essential, elements of a typical digital system is memory. Consequently, the need for ever-faster, denser, and less expensive memories remains unabated.

Computer memories are generally of two kinds: random access memories, or RAMs; and read-only memories, or ROMs. Data can be written into a random access memory and read from it with equal ease. Data can also be read from a read-only memory in the course of normal operation. But, as the name "read-only memory" implies, data is either not written into a read-only memory after the memory's initial programming, or write operations into such memory use special protocols and are performed relatively infrequently.

Read-only memory devices are often based on field-effect transistor (FET) cells. In a single-transistor read-only memory cell, the gate of the transistor serves as the control electrode used for accessing the memory cell, and the transistor combines the storage and access functions of the cell. The digital value programmed into a particular cell is a function of the relative threshold voltage of the cell and the convention used for programming the device containing the cell. The threshold voltage of the cell depends on the doping of the channel of the cell's transistor. For example, if doping increases the threshold voltage of a transistor, the transistor of the doped cell will be in the OFF state. If in the programming convention used the OFF state represents the binary value of "1," then the doped cells of a read-only memory device will be coded with binary "1" values, while the cells that have not been doped will be coded with binary "0" values.

Doping is the introduction of different particles (e.g., dopant atoms) into a semiconductor structure. The introduction of the dopant atoms is generally performed in a controlled manner, so as to dope a predefined area of the semiconductor structure to a required depth with a required concentration. Doping for the purpose of adjusting transistor threshold voltage is often performed by ion implantation, a process of implanting dopant ions in the channel region of the transistor. (The ion implantation doping technique is, of course, also used for other purposes in semiconductor fabrication; for example, it is commonly used for doping source and drain regions of FETs.) Doping by ion implantation is performed by accelerating the required ions to a predefined energy level, and bombarding a target semiconductor material with the ions, to embed the ions in the material. The concentration of the implanted ions can be controlled by the ion accelerator beam current, and by ion implantation time. The time required for ion implantation during the coding of a read-only memory chip device lengthens the total time required for the chip device fabrication, and thus increases the unit cost of the read-only memory chips. Moreover, the ion implantation coding step adds complexity and concomitant cost to the fabrication process. Furthermore, several diffusion-related problems may arise from the doping of the channel areas during ion implantation coding of the memory device.

Diffusion is the natural process through which particles tend to migrate from regions of a relatively high particle concentration to regions with relatively low particle concentrations. Diffusion during ion implantation coding can make it relatively difficult to control the doped (implanted) area with a high degree of precision. The presence of the dopant particles beyond the intended area may cause undesirable changes in the cell's performance, such as degradation of punch-through voltages between adjacent buried source/drain regions, and may also change the coding of adjacent cells. To avoid these potentially harmful consequences, the cells are made sufficiently large to avoid diffusion of large concentrations of implanted ions into the areas where their presence may affect performance or reliability of the fabricated semiconductor memory device. Large size is, of course, the enemy of circuit miniaturization and unit cost. Furthermore, the switching speed of circuits generally decreases with the increase in the size of individual transistors.

A need thus exists in the prior art for faster, simpler, and less expensive processes for use in fabrication of read-only memory devices. A further need exists for a read-only memory device coding process that would both allow scaling down of the individual memory cell size and enable attendant increases in memory device densities and operating frequencies.

SUMMARY OF THE INVENTION

The present invention addresses these needs by providing a semiconductor mask-programmable memory device coded by selective deposition of insulating layers on gate electrodes of the transistor memory cells of the device. The invention herein disclosed comprises a process for fabricating a memory device programmed with a binary code, and the resulting memory device. A dielectric layer is created on a surface of a semiconductor substrate. A plurality of substantially parallel strip-stacked layers is formed on the dielectric layer. Each strip-stacked layer comprises a polysilicon gate electrode layer on the dielectric layer, and a disposable silicon nitride layer disposed on the gate electrode layer. A plurality of source/drain regions is doped in the substrate adjacent to the surface. The source/drain regions are situated so that each strip-stacked layer is disposed substantially between a pair of adjacent source/drain regions. A plurality of first oxide spacers is deposited on the dielectric layer between the strip-stacked layers. The strip-stacked layers are patterned to form a plurality of polysilicon gate electrodes disposed on the dielectric layer and a plurality of disposable silicon nitride pillars disposed on the gate electrodes. Because portions of the strip-stacked layers are removed during the patterning of the strip-stacked layers, a plurality of trenches is created. The trenches are filled by forming a plurality of second oxide spacers, and the disposable pillars are removed to expose the polysilicon gate electrodes under them. A patterned mask is deposited on the memory device to cover the gate electrodes corresponding to active code positions of the memory device in accordance with the predetermined code, while leaving the inactive code positions exposed. Insulating silicon dioxide layers are then deposited on the exposed polysilicon gate electrodes through the openings in the mask, and the mask is removed. A conductive material is then deposited on the memory device and patterned into word lines perpendicular to the source/drain regions.

The word lines contact and interconnect the gate electrodes corresponding to the active code positions, but the insulating layers prevent the word lines from contacting the gate electrodes of inactive code positions. Thus, the memory device is coded through the selective deposition of the insulating layers. As a result of ion implantation not being used for coding, the process window can be broadened and the size of the ROM can be scaled down. The memory device is then further metallized and encapsulated in a package.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention have been described herein. Of course, it is to be understood that not necessarily all such aspects, advantages or features will be embodied in any particular embodiment of the present invention. Additional advantages and aspects of the present invention are apparent in the following detailed description and claims.

BRIEF DESCRIPTION OF THE FIGURES

FIG. 1 is a schematic top view of a mask-programmable read-only memory (ROM) device during an early stage in the fabrication process of the device, with a dielectric gate oxide layer grown on a substrate, a plurality of parallel strip-stacked layers formed on the dielectric gate oxide layer, and source/drain regions deposited in the substrate;

FIG. 2 is a cross-sectional view of the device of FIG. 1, with the section taken along line A—A of FIG. 1;

DETAILED DESCRIPTION OF THE PRESENTLY PREFERRED EMBODIMENTS

Figure 3:
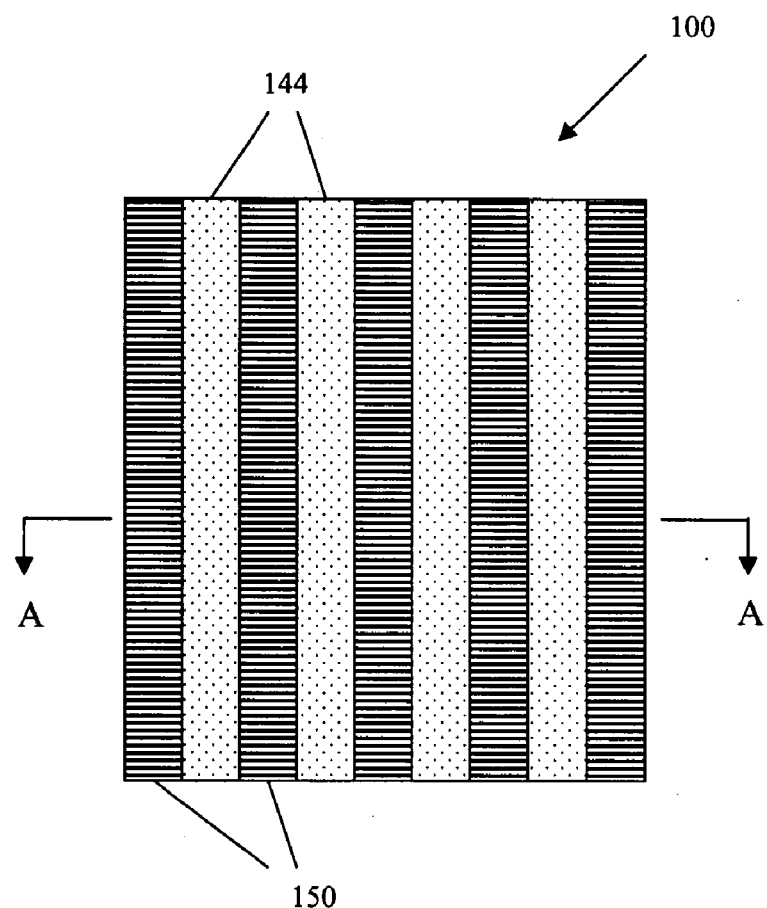
FIG. 3 is a schematic top view of the ROM device during a stage in the fabrication process of the device, with a plurality of first oxide spacers formed on the device.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as top, bottom, left, right, up, down, over, above, below, beneath, rear, and front are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of memory devices. The present invention may be practiced in conjunction with various integrated circuit fabrication techniques that are conventionally used in the art, and only so much of the commonly practiced process steps is included herein as is necessary to provide an understanding of the present invention. Further, certain steps of the process may be performed in various sequences. Therefore, the sequence in which the process steps are described should not be construed as a limitation of the invention. The present invention has applicability, for example, in the field of semiconductor devices and processes in general. For illustrative purposes, however, the following description pertains to a read-only memory device and a method of manufacturing the device on a semiconductor substrate.

Referring more particularly to the drawings, FIG. 1 is a schematic top view of a mask read-only memory device 100 during the fabrication process. FIG. 2 is a cross-sectional view of the memory device 100, with the section taken vertically along line A—A of FIG. 1. Substrate 110 may be made of either p-type or n-type majority carrier doped semiconductor material, depending on whether the transistors of the memory device 100 are designed to have n-channel or p-channel configuration. In this description, it will be assumed that the substrate is made of p-type semiconductor material, but the methods described herein are equally applicable to fabrication of, for example, a device on an n-type substrate, with modifications as needed.

Monocrystalline silicon may be used as the semiconductor material of the substrate 110. Other potential substrate candidate materials include, without limitation, polycrystalline silicone and III–V compound semiconductors. Substrate preparation for semiconductor fabrication may include the steps of tub formation, isolation, and preliminary channel doping. To form a tub, the substrate blank is doped with appropriate impurities. Circuit isolation is achieved, for example, by forming a field oxide to separate the active areas of the multiple transistors of the memory cells. Additionally, a relatively thin pad oxide layer may be deposited on the substrate for protection of the substrate during the fabrication process.

In the illustrated embodiment, dielectric gate oxide layer 130 is grown on the substrate 110. The gate oxide layer 130 may comprise silicon dioxide ($SiO_2$) formed, for example, by thermal oxidation, including dry $O_2$ oxidation and wet or steam ($H_2O$) oxidation. The gate oxide layer 130 may also be deposited on the substrate 110 by a chemical vapor deposition (CVD) method, for example by a low-pressure or sub-atmospheric chemical vapor deposition (LPCVD or SACVD) method. In the illustrated embodiment, the gate oxide layer 130 can have a thickness within a range of about 30 Å to 150 Å, and in one particular embodiment has a thickness of about 30 Å. The oxide of the layer 130 may be grown as a single layer and then etched to produce regions covering individual memory cells or parts thereof using methods well known in the art. The regions may cover, for example, only the channel areas of the transistors, or larger areas. The etching of the oxide layer 130 may be carried out after formation of gate electrodes, discussed below. In modified embodiments, the etching may be modified or omitted. Among the various etching methods that can be employed for etching of the oxide layer 130 (and in other steps of the fabrication process of the memory device 100) are wet etching, dry plasma etching, and reactive ion etching.

The reference numerals 140 refer to a plurality of parallel stripe-stacked layers formed on the combination of the substrate 110 and the gate oxide layer 130. The strip-stacked layers 140 are disposed on the dielectric gate oxide layer 130, and run parallel to one another. Further, each strip-stacked layer 140 comprises two distinct layers: a polysilicon layer 142, and a disposable layer 144. As embodied herein, the disposable layer 144 comprises silicon nitride.

The layers 142 and 144 can be deposited in separate steps. In the illustrated embodiment, the polysilicon layer 142 can be formed by low-pressure chemical vapor deposition to have a thickness within a range of about 500 Å to 2000 Å, and in a particular embodiment has a thickness of about 600 Å. In the illustrated embodiment, the disposable layer 144 can be deposited on the polysilicon layer 142 using chemical vapor deposition methods, for example, thermal, plasma enhanced, and low-pressure chemical vapor deposition methods. The disposable layer 144 can have a thickness within a range of about 600 Å to 3000 Å, and in a particular embodiment has a thickness of about 1000 Å.

A plurality of substantially parallel buried source/drain regions 120 is created in the substrate 110 by doping the corresponding regions of the substrate 110 with n-type dopant, for example, by ion implantation of n-type ions, such as arsenic or phosphorous, into the substrate 110. The doping of the source/drain regions 120 may be performed as follows. An insulating film, e.g., silicon dioxide, is deposited on the wafer containing the memory device 100 by, e.g., chemical vapor deposition. In the illustrated embodiment, the insulating film can have a thickness within a range of about 1000 Å to 5000 Å, and in a particular embodiment has a thickness of about 1600 Å. The insulating film is patterned and etched away from the areas where the source/drain regions 120 are to be formed. The disposable layer 144 may also serve as the insulating film for the etching process. The patterning of the insulating film may be performed using photolithographic techniques known to a person skilled in the art. (Some aspects of photolithographic techniques are described in more detail below.) After the source/drain regions 120 become exposed, they are doped with appropriate impurities. The remaining insulating film is then removed, for example, by washing in a solvent. The doping technique used may comprise an ion implantation process, wherein the disposable layer 144 serves as an ion implantation mask. An annealing process, for example, rapid thermal annealing, then activates the doped impurities. The buried source/drain regions 120 serve as the bit lines of the memory device 100.

Figure 4:
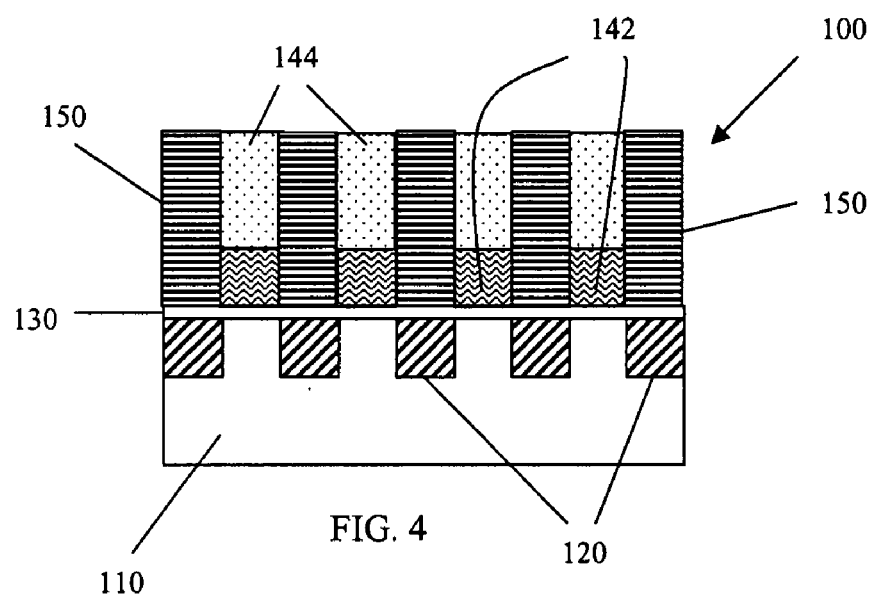
FIG. 4 is a cross-sectional view of the device of FIG. 3, with the section taken along the line A—A of FIG. 3.

Next, a plurality of first oxide spacers 150 is formed over the substrate 110. FIGS. 3 and 4 illustrate the memory device 100 after the formation of the first oxide spacers 150, with FIG. 3 being a schematic top view of the memory device 100 and FIG. 4 being a cross-sectional view of the memory device 100 along the section line A—A of FIG. 3. The first oxide spacers 150 are preferably formed from an oxide material, such as silicon dioxide, by any suitable methods of oxidation, chemical vapor deposition, or other method known to a person skilled in the art of semiconductor fabrication. As can be seen in FIGS. 3 and 4, the first oxide spacers 150 may occupy most or, as presently embodied, all of the space between adjacent strip-stacked layers 140. In the illustrated embodiment, the first oxide spacers 150 can have a thickness within a range of about 800 Å to 3000 Å, and in a particular embodiment have a thickness substantially equal to that of the strip-stacked layers 140. In one embodiment, following deposition of the first oxide spacers 150, they are planarized down, using any suitable process, to the same height as that of the disposable layer 144 to thereby form a relatively planar top surface.

Figure 5:
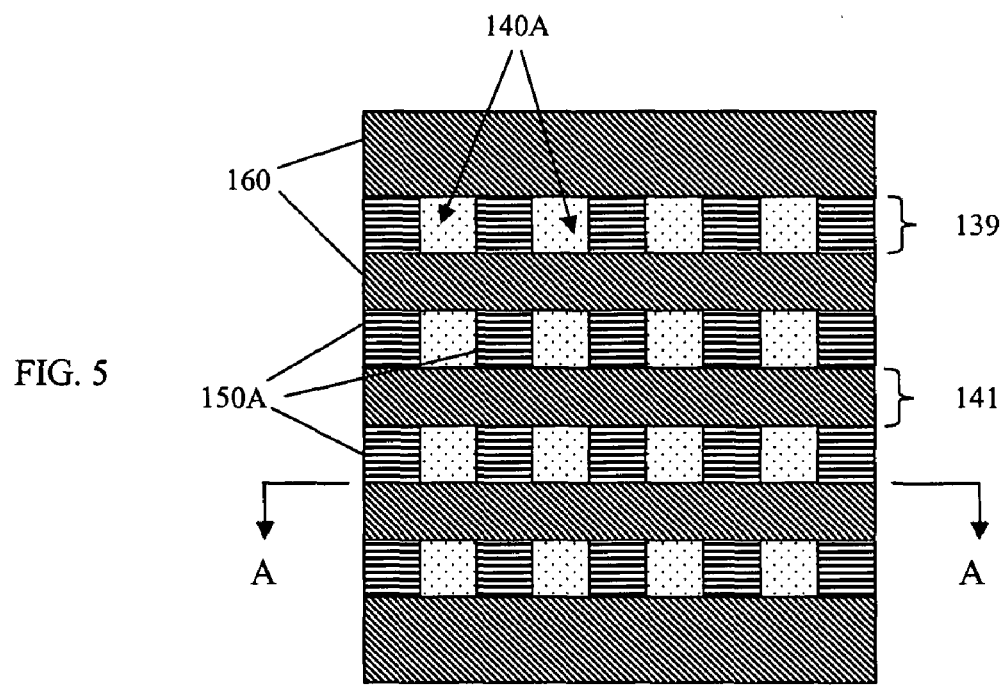
FIG. 5 is a schematic top view of the ROM device during a stage in the fabrication process of the device, wherein the strip-stacked layers have been patterned to form a plurality of polysilicon gate electrodes and a plurality of silicon nitride pillars disposed on the gate electrodes.
Figure 6:
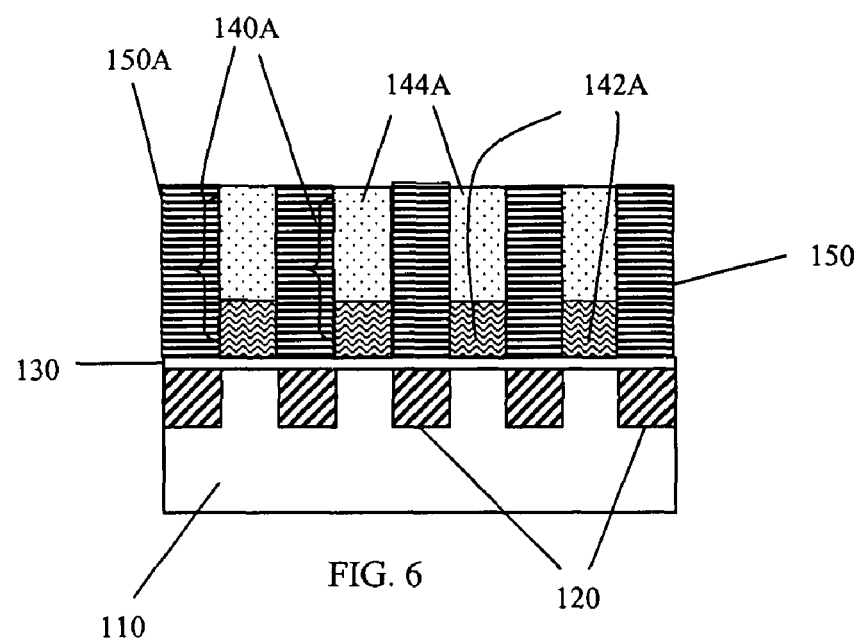
FIG. 6 is a cross-sectional view of the device of FIG. 5, with the section taken along the line A—A of FIG. 5.

In the next step, the strip-stacked layers 140 are patterned to form a plurality of gate pillars 140A. For simplicity, parts of the first oxide spacers 150 may be removed at the same time as well, leaving residual first oxide portions 150A of the first oxide spacers 150. In particular, with reference to FIGS. 5 and 6, the resulting structure from FIGS. 3 and 4, which in the illustrated embodiment comprises a relatively planar top surface, are patterned in the illustrated embodiment to form strips 139 oriented substantially perpendicularly to the buried source/drain regions 120. This patterning generates trenches 141 which define the strips 139, wherein each strip 139 comprises a plurality of gate pillars 140A and a plurality of first oxide portions 150A. Each of the gate pillars 140A comprises a polysilicon gate electrode 142A and a disposable silicon nitride pillar 144A situated on the polysilicon gate electrode 142A. In the illustrated embodiment, the polysilicon gate electrodes 142A are located on every code position. They form the gate electrodes of the transistors of the memory cells of the memory device 100, with the channels of the transistors being defined underneath the polysilicon gate electrodes 142A. The step of forming the polysilicon gate electrodes 142A and the silicon nitride pillars 144A may include the application of a gate-shaping photoresist patterning mask, followed by exposition of the masked memory device 100 to a source of light, and developing of the gate-shaping mask. (Here, and elsewhere in this document, the source of light used for exposing a photoresist mask need not be a source of visible light; the light may lie in a different part of the electromagnetic spectrum, for example, the "light" can be ultraviolet or X-ray radiation. Indeed, for some mask chemistries the exposure may be performed by a particle beam.) The memory device 100 may then be oven-baked to make the gate-shaping photoresist mask more resistant to the post-bake etching. The memory device 100 is then etched to remove either exposed areas or the unexposed areas of the gate-shaping photoresist mask, depending on whether the photoresist is of the positive or negative type. Thus the gate-shaping photoresist mask is patterned so that the future gate pillars 140A are covered, while the remaining portions of the strip-stacked layers 140 are exposed. The memory device 100 may then be dry etched to remove the regions of the strip-stacked layers 140 that need to be removed from the memory device 100 depicted in FIG. 3 in order to produce the gate pillars 140A. The gate-shaping photoresist mask can subsequently be wet-etched to expose the top surfaces of the disposable silicon nitride pillars 144A.

A plurality of second oxide spacers 160 is formed on the sidewalls of the polysilicon gates 142A, the silicon nitride pillars 144A, and the residual portions of the first oxide spacers 150A. In a preferred embodiment, the second oxide spacers 160 run substantially perpendicular to the direction of the buried source/drain regions 120, and fill in the voids left in the memory device 100 after the removal of the portions of the strip-stacked layers 140 during the step of patterning the polysilicon gate electrodes 142A. The patterning of the second oxide spacers 160 can be performed using the same gate-shaping photoresist mask as was used in patterning of the polysilicon gate electrodes 142A. Alternatively, another mask can be formed photolithographically for this purpose. The second oxide spacers 160 can be grown from an oxide material, such as silicon dioxide, using a conventional chemical vapor deposition process, such as an atmospheric, low-pressure, or plasma-enhanced chemical vapor deposition process. In the illustrated embodiment, the second oxide spacers 160 can have a thickness within a range of about 1600 Å to 3000 Å, and in one embodiment they have a thickness about equal to that of the first oxide spacers 150.

Figure 7:
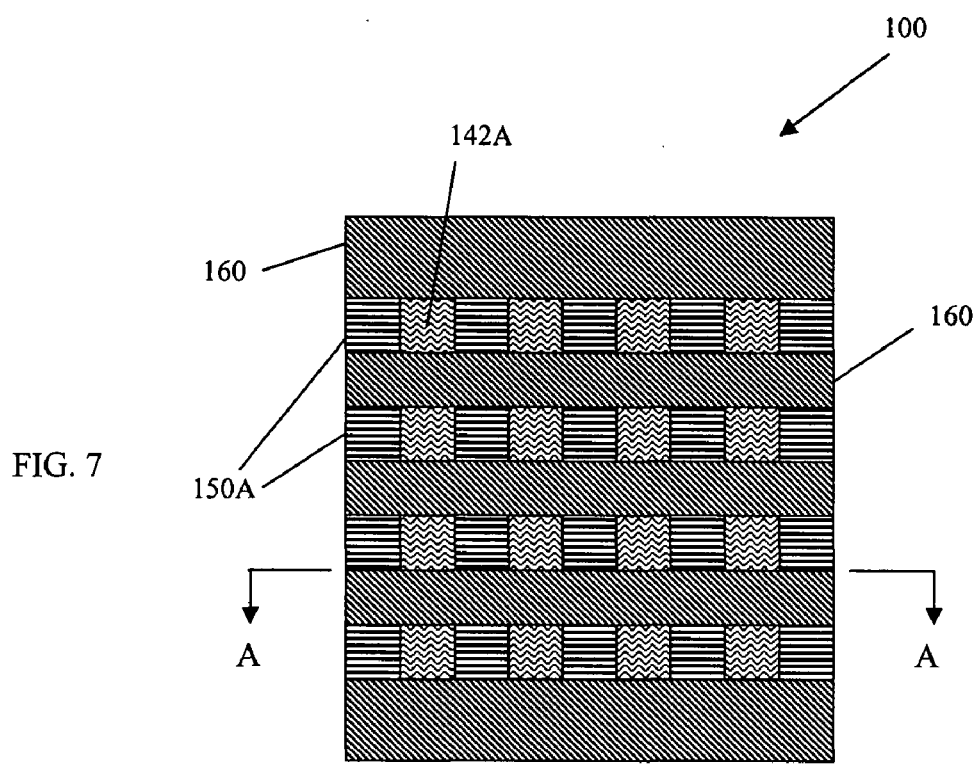
FIG. 7 is a schematic top view of the ROM device during a stage in the fabrication process of the device, with the silicon nitride pillars removed to provide access to the polysilicon gate electrodes.
Figure 8:
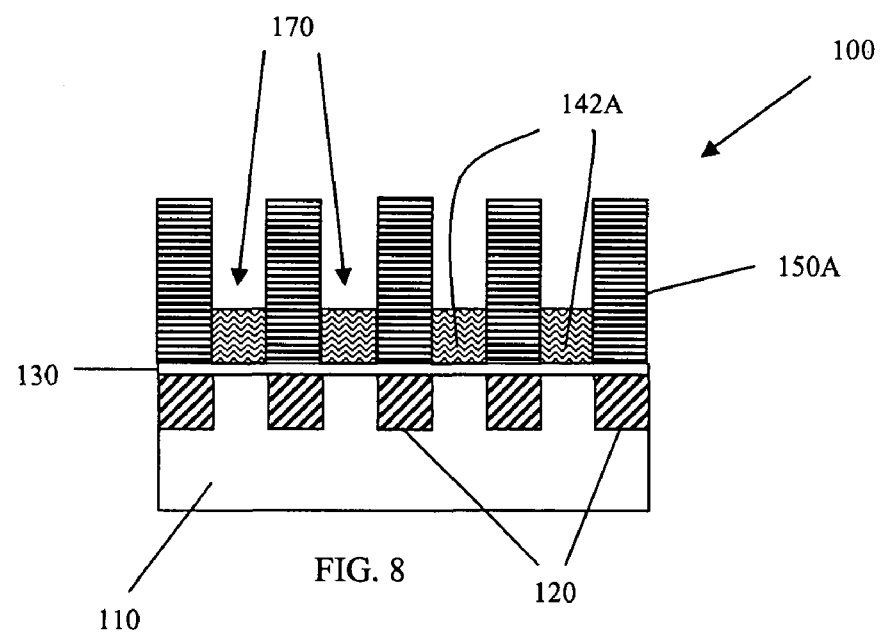
FIG. 8 is a cross-sectional view of the device of FIG. 7, with the section taken along the line A—A of FIG. 7.

Turning to FIGS. 7. and 8, the silicon nitride pillars 144A are removed down to the polysilicon gate electrodes 142A. In the illustrated embodiment, the silicon nitride pillars 144A are removed by an etching process, for example, dry etching through a third photoresist mask. The third photoresist mask is then itself removed by wet etching or rinsing in an appropriate solvent. A plurality of openings 170 is thereby created in place of the silicon nitride pillars 144A, exposing the gate electrodes 142A and rendering them accessible for subsequent processing.

Regarding coding of the cells of the read-only memory device 100, a coding photoresist mask 180 is formed on the memory device 100. The memory device 100 with the coding photoresist mask 180 applied is then exposed to a source of light through a coding pattern. As discussed above in connection with the step of patterning the strip-stacked layers 140, the source of light can be a source of radiation from different parts of the electromagnetic spectrum or even a source of particle radiation, e.g., a source of ultraviolet light, X-ray radiation, or a particle beam. In the illustrated embodiment, the coding photoresist mask 180 is exposed by ultraviolet light. The coding pattern is such that after development of the coding photoresist mask 180, the gates 142A that correspond to active, i.e., real, code positions, i.e., the code positions that are to be connected to the word lines, are covered by the coding photomask 180. The inactive code positions, i.e., the non-real code positions that are to be left unconnected, remain exposed. The photoresist mask 180 is patterned so as to select the active and inactive code positions in accordance with the code that is to be programmed into the memory device 100.

Figure 9:
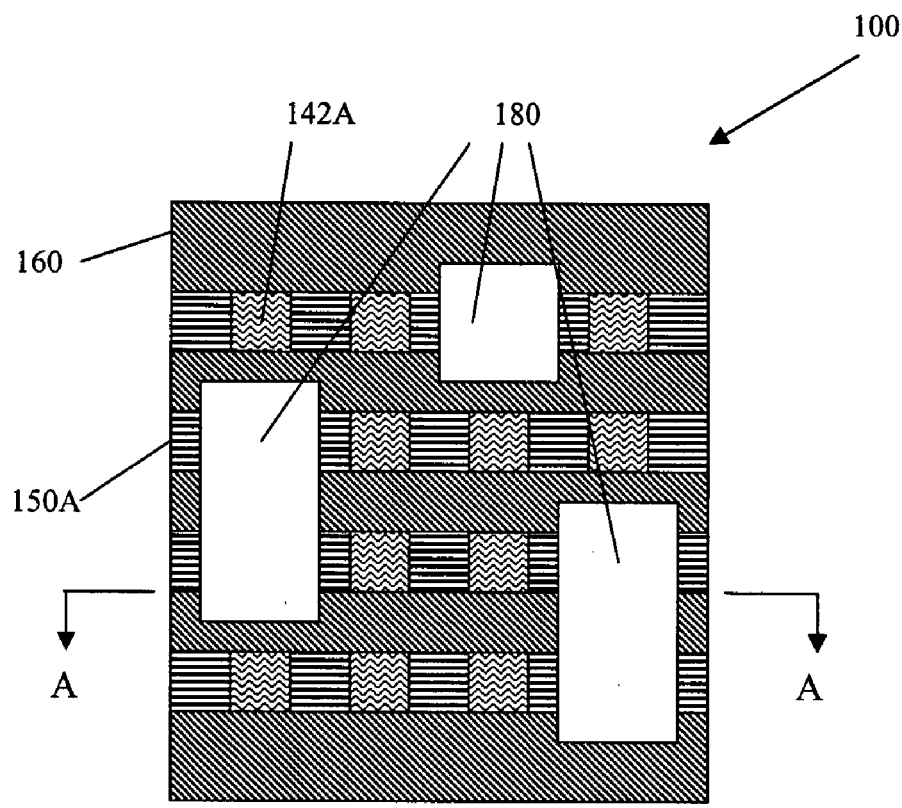
FIG. 9 is a schematic top view of the ROM device during a stage in the fabrication process of the device, with a patterned photoresist coding mask applied.
Figure 10:
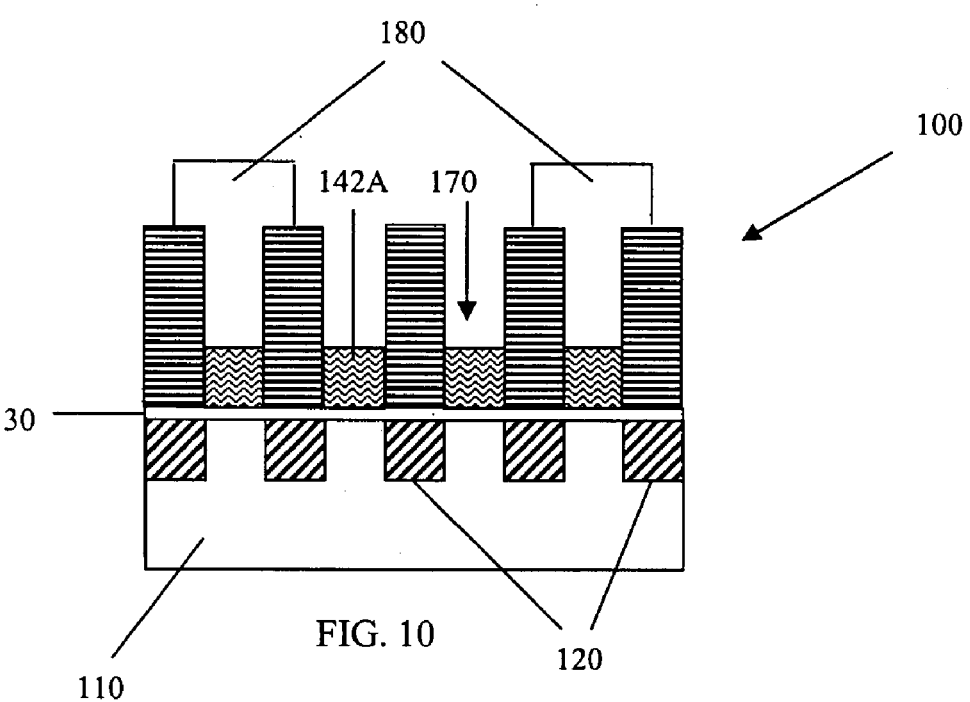
FIG. 10 is a cross-sectional view of the device of FIG. 9, with the section taken along the line A—A of FIG. 9.
Figure 11:
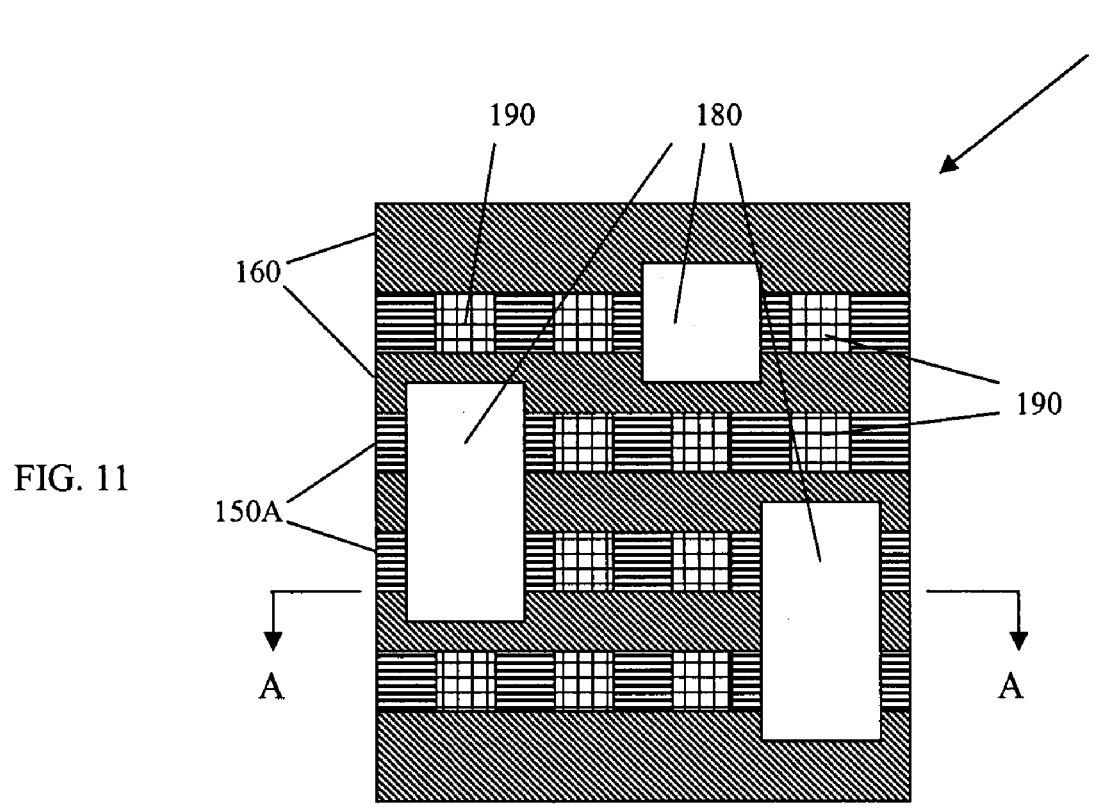
FIG. 11 is a schematic top view of the ROM device during a stage in the fabrication process of the device, with insulating layers deposited onto the exposed gate electrodes through the openings in the patterned photoresist coding mask.
Figure 12:
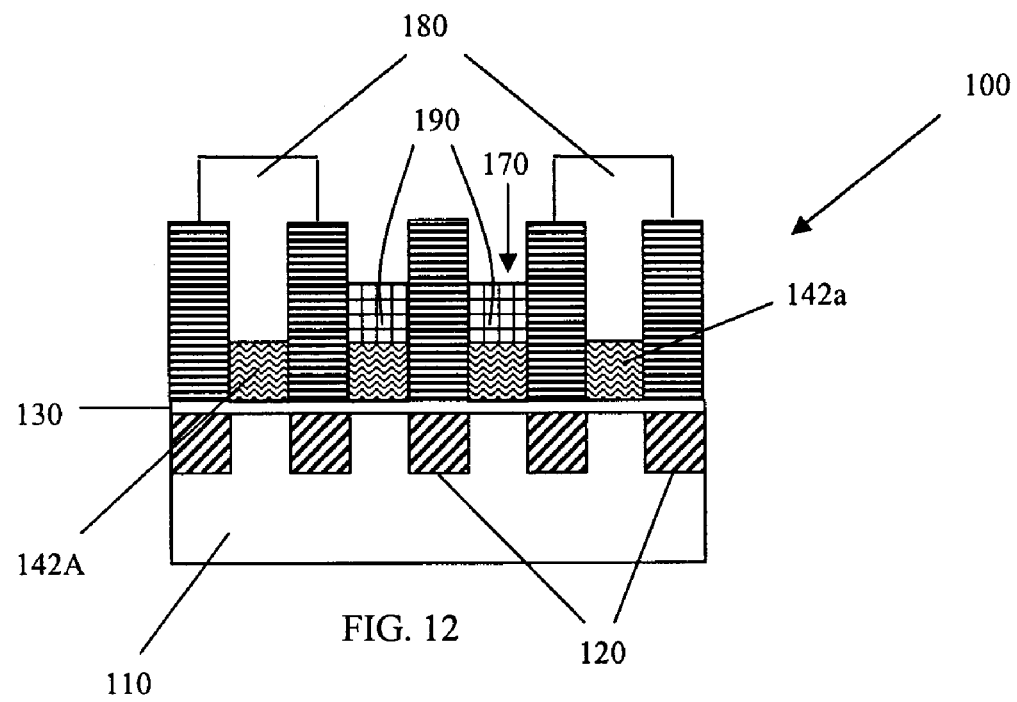
FIG. 12 is a cross-sectional view of the device of FIG. 11, with the section taken along the line A—A of FIG. 11.

The coding photoresist mask is then developed, oven-baked, and etched or rinsed to remove the unwanted photoresist residue. FIGS. 9 and 10 depict the memory device 100 with the resulting patterned photoresist coding mask 180 applied. As in the case of previous figure pairs, FIG. 9 illustrates a schematic top view of the memory device 100, and FIG. 10 illustrates a view of the memory device 100 along the section line A—A of FIG. 9. A plurality of insulating layers 190 is then deposited through the openings 170 onto the exposed gate electrodes 142A, preventing the exposed gates from connecting to word lines during the subsequent metallization process. In the illustrated embodiment, the patterned photoresist mask 180 covers substantially all areas of the memory cells except the exposed gates on which the insulating layers 190 are deposited. This step is represented in FIGS. 11 and 12.

The insulating layers 190 may comprise silicon dioxide, silicon nitride, silicon oxynitride, or a polymer material. In the illustrated embodiment, the insulating layers 190 comprise silicon dioxide and are deposited using a spin-on coating (also known as spin-on deposition) method. During spin-on coating, the deposited material is mixed with a solvent and spin-coated onto the spinning target. The solvent can then be driven out and the deposited layer cured, for example, by oven baking or laser heating, leaving behind a layer of the deposited material. The patterned photoresist mask 180 is applied so as to select the active and inactive code positions in accordance with the code that is to be programmed into the memory device 100.

Figure 13:
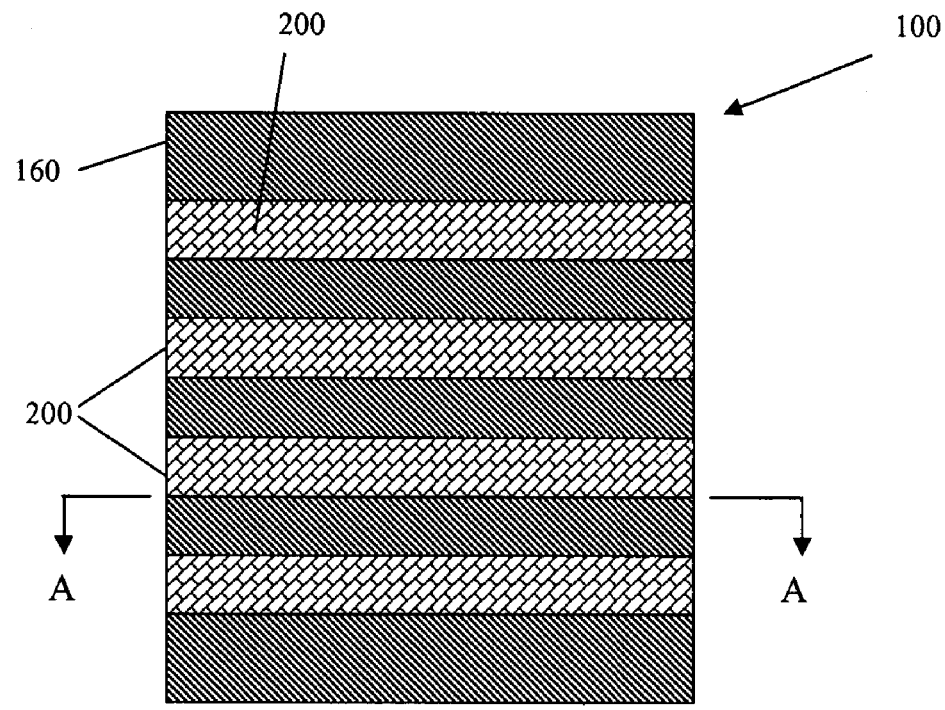
FIG. 13 is a schematic top view of the ROM device during a stage in the fabrication process of the device, with the patterned photoresist coding mask removed and a plurality of deposited word lines interconnecting non-insulated gate electrodes of the device.
Figure 14:
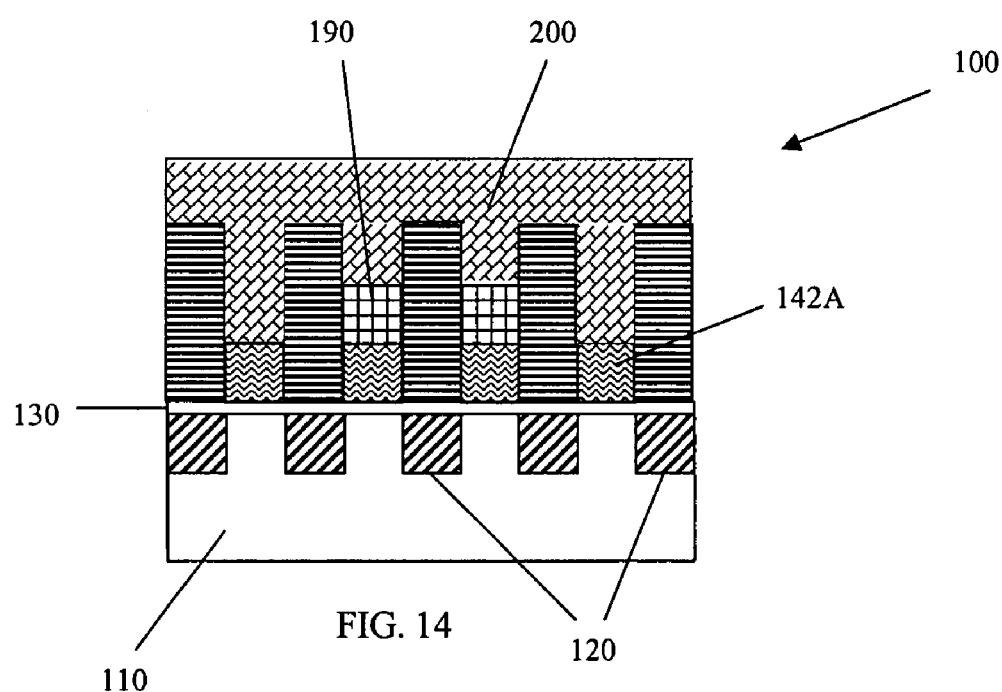
FIG. 14 is a cross-sectional view of the device of FIG. 13, with the section taken along the line A—A of FIG. 13.

The patterned photoresist mask 180 is subsequently removed from the memory device 100, for example, by solvent cleaning, ashing, or bringing the photoresist mask 180 in contact with a polishing pad and rotating the pad. A conductive material is then deposited on the device to interconnect the gate electrodes 142A into a plurality of word lines 200. The word lines 200 can be patterned, for example, by selective deposition using a word-line mask patterned by standard photolithographic techniques, such as those described above in connection with various etching and patterning processes. The formation of the word lines 200 is elucidated in FIGS. 13 and 14. In accordance with one aspect of the present invention, the word lines 200 do not electrically connect all of the gate electrodes 142A. Only those gate electrodes 142A that are not shielded by the insulating layers 190 are connected to the word lines 200. The gate electrodes 142A that correspond to the code positions where the insulating layers 190 have been deposited, remain electrically isolated from the word lines 200. The memory device 100 is thus coded without the use of ion-implantation for this purpose.

In the illustrated embodiment, aluminum is used as the conductive material of the word lines 200. Many additional materials are also potential candidates for such interconnections, including, for example, copper, gold, silver, tungsten and titanium. Various alloys of these conducting metals and other conductors are suitable for use as well. The conductive material may be formed into the word lines 200, for example, by the use of plasma deposition, spin-on deposition, sputter deposition, and evaporation techniques. Finally, the coded memory device 100 may further be metallized and encapsulated in a protective layer of glass, plastic, ceramic, resin, or other suitable material.

In view of the foregoing, it will be understood by those skilled in the art that the methods of the present invention can facilitate formation of memory devices, such as mask-programmable read-only memory devices in an integrated circuit, without the use of ion implantation coding. It should be noted, however, that doping procedures, including ion implantation, could be used for other purposes in the course of fabrication of the memory devices. Therefore, the scope of the invention, as defined in the claims, extends, for example, to devices with channel doping of individual cells. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of programming memory cells of a memory device, the method comprising;
    selectively depositing a first insulating layer over a first portion of the memory cells in a region of the memory device while not depositing the first insulating layer over a second portion of the memory cells; and
    selectively depositing a second insulating layers over the second portion of the memory cells in the region while not depositing the second insulating layers over the first portion of the memory cells, to thereby program the memory device.

2. The method as set forth in claim 1, wherein the first and second portions comprise at least one of electrodes, channels and gate electrodes.

3. The method as set forth in claim 1, wherein the first insulating layer comprises photoresist.

4. The method as set forth in claim 1, and further comprising:
    removing the first insulating layer; and
    forming a conductive layer to contact the first portions.

5. The method as set forth in claim 4, wherein:
    the memory cells are transistors;
    the first and second portions are gate electrodes;
    word lines extend over the gate electrodes;
    gate electrodes of the second portion are not connected to the ward lines; and
    gate electrodes of the first portion are connected to the word lines.

6. The method as set forth in claim 1, wherein substantially all of the memory cells of the memory device have substantially the same threshold voltages.

7. A method of programming a memory device having a plurality of memory cells positioned to be coupled to corresponding word lines, the method comprising masking predetermined ones of the plurality of memory cells, followed by masking other memory cells and coupling the predetermined ones of the plurality of memory cells to their corresponding word lines while leaving the other memory cells of the plurality of memory cells relatively decoupled from their corresponding word lines.

8. The method as set forth in claim 7, wherein:
    the masking of the predetermined ones of the plurality of memory cells is followed by unmasking of the predetermined ones of the plurality of memory cells to enable them to be coupled to their corresponding word lines;
    the predetermined ones of the plurality of memory cells are not disabled; and
    the other memory cells of the plurality of memory cells are disabled.

9. The method as set forth in claim 7, wherein insulating layers are disposed between the relatively decoupled memory cells and their corresponding word lines, but are not disposed between the coupled memory cells and their corresponding word lines.

10. The method as set forth in claim 9, wherein:
    each memory cell comprises a transistor having two source/drain regions and a gate; and
    the insulating layers are disposed between gates of the relatively decoupled memory cells and their corresponding word lines.

11. The method as set forth in claim 7, wherein substantially all of the memory cells of the memory device have substantially the same threshold voltages.

12. The method as set forth in claim 7, wherein substantially none of the memory cells of the memory device arc ion-implantation coded.

13. A memory device fabricated according to the method of claim 7.

14. The method as set forth in claim 7, wherein substantially all of the predetermined ones and the other memory cells of the plurality of memory cells have substantially the same threshold voltages.

15. The method as set forth in claim 7, wherein the masking of predetermined ones of the plurality of memory cells is performed wit a first insulating layer and the masking of other memory cells of the plurality of memory cells is performed with a second insulating layer.

16. A method of programming a memory device comprising disabling predetermined memory cells of the memory device by electrically insulating the predetermined memory cells from word lines of the memory device to which the predetermined memory cells would otherwise be electrically coupled but for the disabling, whereby non-disabled memory cells of the memory device are masked before the disabling and then not insulated from, or insulated to a lesser extent from, corresponding word lines of the memory device.

17. The method as set forth in claim 16, wherein a first portion of memory cells corresponding to a word line are disabled and a second portion of memory cells corresponding to the same word line are not disabled.

18. The method as set forth in claim 16, wherein insulating layers are disposed between channels of the disabled memory cells and their corresponding word lines, but are not disposed between channels of the non-disabled memory cells and their corresponding word lines.

19. The method as set forth in claim 16, wherein:
    each memory cell comprises a transistor having two source/drain regions and a gate;
    insulating layers are disposed between gates of the disabled memory cells and their corresponding word lines; and
    insulating layers are not disposed between gates of the non-disabled memory cells and their corresponding word lines.

20. The method as set forth in claim 16, wherein the method further comprises:
    providing a substrate having a first surface;
    creating a dielectric layer on the first surface of the substrate;
    forming a plurality of substantially parallel strip-stacked layers on the dielectric layer, each strip-stacked layer comprising a disposable layer formed on a gate electrode layer, the gate electrode layer of each strip-stacked layer being disposed on the dielectric layer;

forming a plurality of source/drain regions in the substrate, each source/drain region being adjacent to the first surface of the substrate, wherein each strip-stacked layer is disposed substantially between a pair of adjacent source/drain regions;

forming a plurality of first spacers on the dielectric layer, each of the first spacers being disposed between two adjacent strip-stacked layers;

patterning the strip-stacked layers to form a plurality of gate electrodes disposed on the dielectric layer and a plurality of disposable pillars disposed on the gate electrodes, wherein portions of the strip-stacked layers are removed thereby creating a plurality of apertures;

forming a plurality of second spacers within the apertures; and removing the plurality of the disposable pillars to form a plurality of openings tat expose the plurality of gate electrodes;

wherein the masking of non-disabled memory cells comprises forming a patterned mask to cover the gate electrodes corresponding to active code positions of the memory device in accordance with the code;

wherein the disabling of predetermined memory cells further comprises depositing insulating layers on the gate electrodes corresponding to inactive code positions of the memory device in accordance with the code, removing the patterned mask, and forming a plurality of word lines interconnecting the gate electrodes corresponding to the active code positions, each word line being disposed substantially perpendicularly to the source/drain regions, the gate electrodes corresponding to the inactive code positions being electrically isolated from the word lines.

21. The method as set forth in claim 20, wherein:

portions of the first spacers are removed during the step of patterning; and the forming of a plurality of second spacers comprises forming a plurality of second spacers in place of at least the portions of the first spacers that have been removed.

22. The method as set forth in claim 21, wherein:

the forming of a plurality of substantially parallel strip-stacked layers comprises forming a plurality of polysilicon gate electrode layers and a plurality of silicon nitride disposable layers;

the depositing of insulating layers comprises spin-on coating silicon dioxide insulating layers;

the forming of a patterned mask comprises forming a patterned photoresist mask;

the forming of a plurality of first spacers comprises forming a plurality of first silicon dioxide spacers; and the forming of a plurality of second spacers comprises forming a plurality of second silicon dioxide spacers.

23. The method as set forth in claim 16, wherein substantially all of the predetermined memory cells and the non-disabled memory cells of the memory device have substantially the same threshold voltages.

24. The method as set forth in claim 16, whereby, after the disabling, non-disabled memory cells of the memory device are not insulated from, or insulated to a lesser extent from, corresponding word lines of the memory device.

* * * * *